United States Patent [19]

Jhabvala

[11] 4,272,302

[45] Jun. 9, 1981

[54] METHOD OF MAKING V-MOS FIELD EFFECT TRANSISTORS UTILIZING A TWO-STEP ANISOTROPIC ETCHING AND ION IMPLANTATION

[75] Inventor: Murzban D. Jhabvala, Seabrook, Md.

[73] Assignee: The United States of America as represented by the Administrator of the National Aeronautics and Space Administration, Washington, D.C.

[21] Appl. No.: 72,727

[22] Filed: Sep. 5, 1979

[51] Int. Cl.³ .................. H01L 21/265; H01L 21/306
[52] U.S. Cl. .......................... 148/1.5; 29/571; 29/578; 29/580; 148/187; 156/647; 156/648; 156/649; 357/23; 357/55; 357/60; 357/91
[58] Field of Search ............... 148/1.5, 187; 29/571, 29/578, 580; 156/647, 648, 649; 357/23, 55, 60, 91

[56] References Cited

U.S. PATENT DOCUMENTS

| | | | |
|---|---|---|---|
| 3,668,481 | 6/1972 | Saltich et al. | 357/55 X |
| 3,920,482 | 11/1975 | Russell | 357/55 X |
| 3,975,221 | 8/1976 | Rodgers | 29/571 X |
| 3,986,200 | 10/1976 | Allison | 357/55 |
| 4,003,036 | 1/1977 | Jenne | 357/55 X |
| 4,003,126 | 1/1977 | Holmes et al. | 29/580 X |
| 4,049,476 | 9/1977 | Horie | 148/1.5 X |
| 4,056,413 | 11/1977 | Yoshimura | 29/580 X |
| 4,084,175 | 4/1978 | Ouyang | 357/55 |
| 4,089,021 | 5/1978 | Sato et al. | 156/647 X |
| 4,102,714 | 7/1978 | DeBar et al. | 148/187 |
| 4,113,516 | 9/1978 | Ponczak et al. | 148/1.5 |
| 4,116,720 | 9/1978 | Vinson | 148/1.5 |
| 4,140,558 | 2/1979 | Murphy et al. | 148/187 X |
| 4,156,289 | 5/1979 | Hoffmann et al. | 357/55 X |

*Primary Examiner*—L. Dewayne Rutledge
*Assistant Examiner*—W. G. Saba
*Attorney, Agent, or Firm*—John O. Tresansky; John R. Manning; Robert D. Marchant

[57] ABSTRACT

A method of making V-MOS field effect transistors is disclosed wherein a masking layer is first formed over a surface of a crystalline substrate. An aperture is then formed in the masking layer to expose the surface of the substrate. An anisotropic etchant is applied to the exposed surface so that a groove having a decreasing width within increasing depth is formed. However, the etch is not allowed to go to completion with the result that a partially formed V-shaped groove is formed. Ions are accelerated through the aperture for implantation in the crystalline substrate in the lower portion of the partially formed V-shaped groove. Thereafter, an anisotropic etchant is reapplied to the partially formed V-shaped groove, and the etch is allowed to go to completion.

4 Claims, 11 Drawing Figures

METHOD OF MAKING V-MOS FIELD EFFECT TRANSISTORS UTILIZING A TWO-STEP ANISOTROPIC ETCHING AND ION IMPLANTATION

ORIGIN OF THE INVENTION

The invention described herein was made by an employee of the United States government and may be manufactured and used by or for the government for governmental purposes without the payment of any royalties thereon or therefor.

BACKGROUND OF THE INVENTION

The invention generally relates to the field of semiconductor device manufacture and more particularly to a new method of making V-MOS field effect transistors.

The basic advantage of V-MOS technology is the ability to provide a very short channel, L, between the source and drain regions of a field effect transistor without any deleterious effects. Prior art methods of manufacturing V-MOS field effect transistors rely on the fact that anisotropic etchs are available that etch certain silicon crystal planes more readily than other crystal planes. $N_2H_4$ and KOH are two such etchants that dissolve the <100> planes much more rapidly than the <111> planes. The channel length, L, of the V-MOS transistor can be easily calculated. <111> planes intersect the <100> planes at 55 degrees. Knowing this, the channel length, L, is given by the following equation:

$$L = 2(0.86W - 1.2X_j),$$

where W is the mask opening and $X_j$ is the diffusion depth. The channel length, L, is then controlled by the mask opening, W, and the diffusion depth, $X_j$, both of which can be only moderately controlled at best. Because of this, diffusion spikes which short the source and drain regions of the transistor sometimes occur. A vast improvement in channel length control could be achieved if it were possible to eliminate the effect of either of the parameters W or $X_j$.

SUMMARY OF THE INVENTION

It is therefore an object of the present invention to provide an improved method of making V-MOS field effect transistors wherein the parameter $X_j$ is eliminated as a controlling factor in determining the length of the channel in a V-MOS field effect transistor.

It is another object of the invention to provide for the precise control of the channel length in the manufacture of a V-MOS field effect transistor by a simple process.

It is a further object of the invention to eliminate the effect of shorting diffusion spikes and the effects of furnace temperature variations, pre-deposition concentration and other factors determining final junction depth in the manufacture of V-MOS field effect transistors.

The foregoing and other objects are accomplished by providing a method wherein a masking layer is first formed over a surface of a crystalline substrate. An aperture is then formed in the masking layer to expose the surface of the substrate. An anisotropic etchant is applied to the exposed surface so that a groove having a decreasing width with increasing depth is formed. However, the etch is not allowed to go to completion with the result that a partially formed V-shaped groove is formed. Ions are accelerated through the aperture for implantation in the crystalline substrate in the lower portion of the partially formed V-shaped groove. Thereafter, an anisotropic etchant is reapplied to the partially formed V-shaped groove, and the etch is allowed to go to completion. By using ion implantation when the V-shaped groove is only partially formed and then completing the etch of the V-shaped groove, penetration of the ion implantation diffusion region between the source and drain regions is assured, and the resulting channel length can be very precisely controlled.

BRIEF DESCRIPTION OF THE DRAWINGS

The specific nature of the invention, as well as other objects, aspects, uses and advantages thereof, will clearly appear from the following description and from the accompanying drawings, in which.

DESCRIPTION OF THE PREFERRED EMBODIMENT

Figure 1:
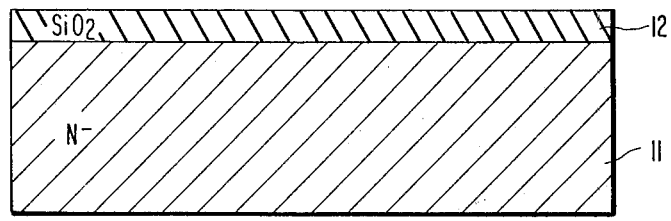
FIGS. 1 to 11 are cross-sectional views illustrating the process of manufacturing a V-MOS field effect transistor according to the present invention.
Figure 2:
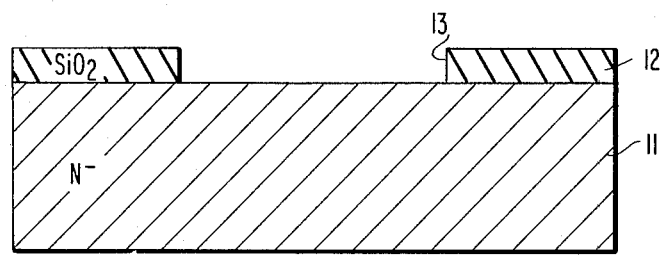

Referring now to the drawings, the <100> surface of an N$^-$ Si substrate 11 is oxidized in an $O_2$, $H_2O$ atmosphere at 1000° C. to form an $SiO_2$ layer 12 as shown in FIG. 1. The $SiO_2$ layer 12 is coated with a photoresist which is exposed, developed and rinsed to form a mask defining a P+ region aperture exposing $SiO_2$ layer 12. HF is applied to the exposed $SiO_2$ layer to expose the <100> surface of the substrate 11 thereby forming the P+ region aperture 13 in the $SiO_2$ layer 12 as shown in FIG. 2. Once this aperture is formed, the photoresist is removed with chromic acid and the wafer is rinsed.

Figure 3:
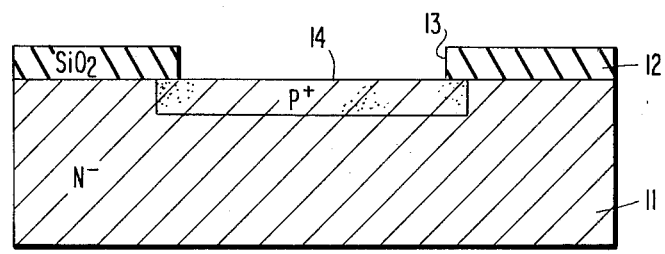
Figure 4:
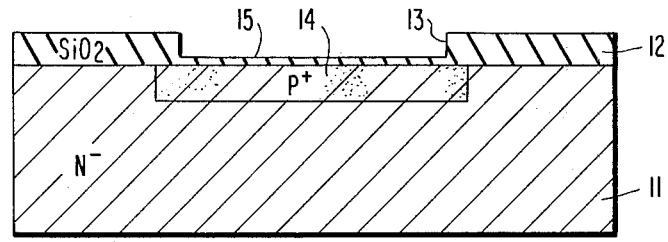

The exposed surface of the substrate 11 is predoped with boron. The predoped substrate is then heated in an oxygen atmosphere to diffuse B+ into the substrate 11 to form the P+ region 14 as shown in FIG. 3. This region will be divided into source and drain regions as will become apparent from the following description. The diffusion process is well known to those skilled in the art and it is carried out for a time and at a temperature to provide the desired diffusion depth of the P+ region. For example, the substrate can be heated for 10 minutes in an $O_2$ atmosphere at 1000° C. followed by 40 minutes in an $O_2$, $H_2O$ atmosphere at 1000° C. This can be followed by heating the substrate in a $O_2$ atmosphere at 1200° C. for a short time to further increase the diffusion depth. Inherent in this diffusion process is the formation of an $SiO_2$ layer 15 over the P+ region as shown in FIG. 4. It is desirable to increase the thickness of this layer, and this is accomplished by heating for 50 minutes in an $O_2$, $H_2O$ atmosphere at 1000° C.

Figure 5:
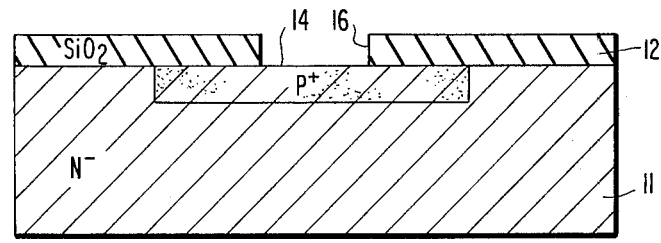

The $SiO_2$ layer is again coated with a photoresist which is exposed, developed and rinsed to form a V-groove mask exposing the $SiO_2$ layer. HF is applied to the exposed $SiO_2$ layer to expose the <100> surface of the substrate 11 to form a V-groove aperture 16 as shown in FIG. 5. The photoresist is then removed with chromic acid, and the wafer is rinsed.

Figure 6:
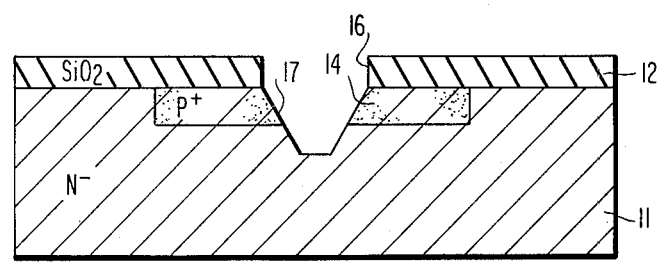

The next step is to apply the anisotropic etch KOH to the exposed <100> surface of the substrate 11. Up to this point, the process described is quite conventional, and normally the anisotropic etch would etch a self-stopping V-groove in the substrate. According to the invention, however, instead of letting the etch go to completion, it is only allowed to go to partial completion resulting in the structure shown in FIG. 6. This is accomplished by applying KOH at 80° C. for 10 minutes. The KOH etch is stopped by transferring the wafer to a water bath. It will be observed that the partially formed V-groove 17 penetrates the P+ region 14 dividing it into two parts which will become the source and drain regions of the field effect transistor.

Figure 7:
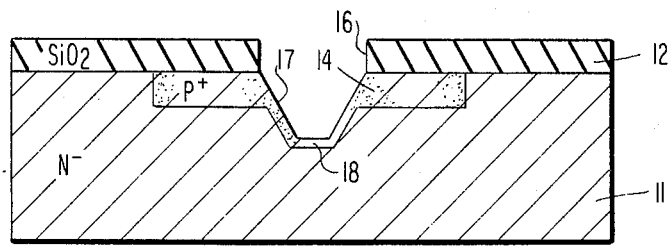

Ion implantation is then carried out by accelerating boron ions at 52 Kev in a concentration of $10^{13}$ B+ ions/cm$^2$ through the aperture for implantation in the substrate 11 in the lower portion of the partially formed V-groove 17. The substrate is then heated for 15 minutes in an N$_2$ atmosphere at 1000° C. to produce the diffusion region 18 shown in FIG. 7. Ion implantation is a very accurate and precise method of defining the crucial geometry of the diffusion 18, and this is critical to the invention as will be appreciated as the description proceeds.

Figure 8:
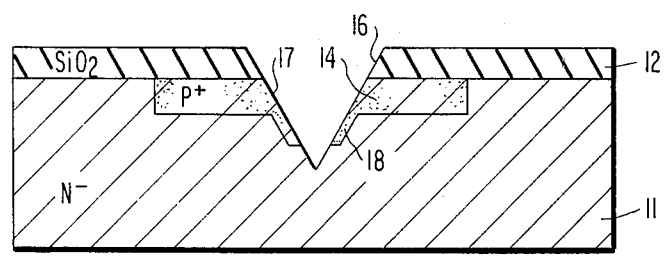

The wafer may be dipped in HF for approximately 10 seconds and then rinsed. This has the effect of beveling the edge of the SiO$_2$ Layer. The KOH is reapplied to a period of approximately 6 minutes so that the V-groove etch is completed as shown in FIG. 8. As is now apparent from FIG. 8, the completed V-groove 17 completely penetrates the diffusion region 18 thereby assuring that no shorts due to diffusion spikes will occur. The channel length, L', as produced by the process according to the invention is defined by the following expression:

$$L' \simeq 2(0.86)W',$$

where W' is now determined by W and the etchant time. The ion implantation defines the bottom ledge of the diffusion insuring uniformity. The channel length, L', is independent of furnace time provided high temperature is avoided to keep the diffusion relatively shallow.

Figure 9:
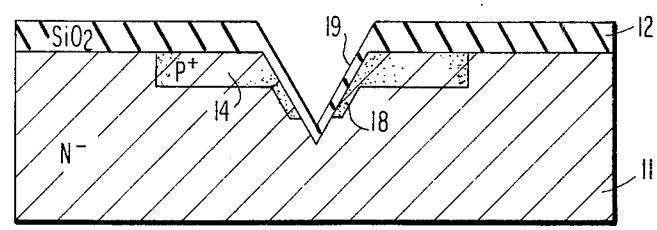
Figure 10:
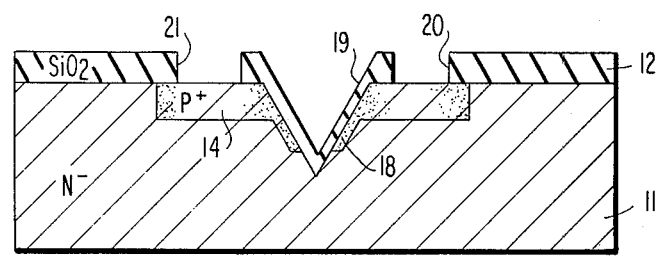
Figure 11:
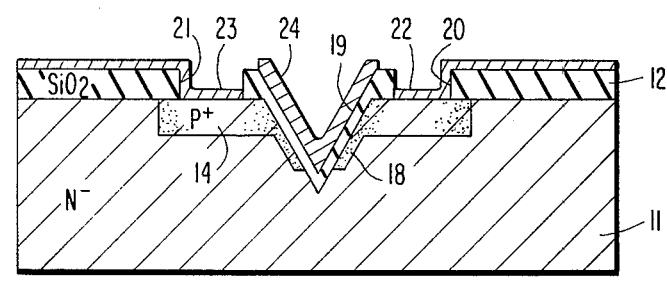

To complete the manufacture of the V-MOS field effect transistor, chromic acid is applied to the wafer, and the wafer is then rinsed. An oxide layer 19 is formed on the surfaces of the completed V-groove as shown in FIG. 9 by heating in an atmosphere of O$_2$, H$_2$O for 30 minutes at 1000° C. The oxide layer 19 will form the gate oxide and may be further treated to increase its thickness or vary its electrical properties according to processes which are well known in the art. The resulting SiO$_2$ layer is then coated with a photoresist which is exposed, developed and rinsed to form a mask defining source and drain electrode regions on either side of the V-groove exposing the SiO$_2$ layer. HF is applied to the exposed SiO$_2$ layer to expose the surface of the substrate 11 forming apertures 20 and 21 as shown in FIG. 10. Thereafter, the photoresist is removed with chromic acid, and the wafer is rinsed. Metallic electrodes are then deposited on the exposed source and drain electrode regions and on the gate oxide layer to form source, drain and gate electrodes 22, 23 and 24, respectively, as shown in FIG. 11.

The advantages of the process according to the invention can be summarized as follows:

1. The effect of shorting diffusion spikes is eliminated.
2. The very accurate and precise method of ion implantation defines the crucial geometry of the diffusion.
3. The effect of furnace temperature variations, predeposition concentration and other factors determining final junction depth is eliminated.
4. The process is simple.

It will be understood by those skilled in the art that the embodiment shown and described is only exemplary and that various modifications can be made in the practice of the invention within the scope of the appended claims.

What is claimed is:

1. A method of making a V-MOS field effect transistor comprising the steps of:

forming a masking layer over a surface of a crystalline substrate;

opening an aperture in said masking layer to expose said surface of said substrate;

applying an anisotropic etchant to said exposed surface to etch a groove in said crystalline substrate, said groove having a decreasing width with increasing depth;

inhibiting the effect of said anisotropic etchant before the etch goes to completion so that a V-shaped groove is only partially formed;

accelerating ions through said aperture for implantation in said crystalline substrate in the lower portion of the partially formed V-shaped groove; and thereafter reapplying an anisotropic etchant to said partially formed V-shaped groove and allowing the etch to go to completion.

2. The method of making a V-MOS field effect transistor as recited in claim 1 further including the step of:

forming an oxide layer on the surfaces of the completed V-shaped groove.

3. The method of making a V-MOS field effect transistor comprising the steps of:

forming a masking layer over a surface of a crystalline substrate of one conductivity type;

opening a first aperture in said masking layer to expose said surface of said substrate;

forming a region of a second conductivity type in said substrate through said first aperture;

forming an oxide layer over the exposed surface of said substrate to cover said region of said second conductivity type;

thereafter opening a second aperture in said oxide layer to expose a surface over said region of said second conductivity type, said second aperture being smaller than said first aperture;

applying an anisotropic etchant to said exposed surface over said region of said second conductivity type to etch a groove in said crystalline substrate, said groove having a decreasing width with increasing depth;

inhibiting the effect of said anisotropic etchant before the etch goes to completion so that a V-shaped groove is only partially formed, the partially formed V-shaped groove penetrating said region of said second conductivity type and dividing it into two parts;

accelerating ions through said second aperture for implantation in said crystalline substrate in the lower portion of the partially formed V-shaped groove, said ions forming a bridging diffusion region of said second conductivity type connecting the two parts of the region divided by said partially formed V-shaped groove; and thereafter reapplying an anisotropic etchant to said partially formed V-shaped groove and allowing the etch to go to completion, the completed V-shaped groove penetrating said bridging region.

4. The method of making a V-MOS field effect transistor as recited in claim 3 further including the steps of:

forming an oxide layer on the surfaces of the completed V-shaped groove;

opening third and fourth apertures in said oxide layer on either side of said completed V-shaped groove to expose surfaces over the divided parts of said region of said second conductivity type; and forming metallic electrodes on said exposed surfaces and on the oxide layer on the surfaces of the completed V-shaped groove.

* * * * *